(12) United States Patent
Ueda

(10) Patent No.: US 6,617,615 B1
(45) Date of Patent: Sep. 9, 2003

(54) SEMICONDUCTOR LIGHT-EMITTING DEVICE

(75) Inventor: Takashi Ueda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/111,849

(22) PCT Filed: Oct. 30, 2000

(86) PCT No.: PCT/JP00/07512

§ 371 (c)(1),
(2), (4) Date: Apr. 30, 2002

(87) PCT Pub. No.: WO01/33641

PCT Pub. Date: May 10, 2001

(30) Foreign Application Priority Data

Nov. 1, 1999 (JP) .......................................... 11-311099
Nov. 1, 1999 (JP) .......................................... 11-311101

(51) Int. Cl.$^7$ .............................................. H01L 33/00
(52) U.S. Cl. ............................ 257/98; 257/95; 257/100
(58) Field of Search ................ 257/95, 98, 84, 257/99, 100

(56) References Cited

U.S. PATENT DOCUMENTS

| | | | | |
|---|---|---|---|---|
| 5,455,390 A | * | 10/1995 | DiStefano et al. | 174/262 |
| 6,185,161 B1 | * | 2/2001 | Arikawa et al. | 368/84 |
| 6,228,228 B1 | * | 5/2001 | Singh et al. | 204/192.1 |
| 2001/0012045 A1 | * | 8/2001 | Goto et al. | 347/187 |
| 2002/0003233 A1 | * | 1/2002 | Mueller-Mach et al. | 257/84 |

FOREIGN PATENT DOCUMENTS

| | | | | |
|---|---|---|---|---|
| JP | 6265386 A | * | 3/1987 | ........... H01L/33/00 |
| JP | 62-65386 | | 3/1987 | |
| JP | 3-113856 U | | 11/1991 | |
| JP | 5-15457 U | | 2/1993 | |
| JP | 5-110129 | | 4/1993 | |
| JP | 6-45637 | | 2/1994 | |
| JP | 11145508 A | * | 5/1999 | ........... H01L/31/12 |

\* cited by examiner

*Primary Examiner*—Wael Fahmy
*Assistant Examiner*—William C Vesperman
(74) *Attorney, Agent, or Firm*—Morgan, Lewis & Bockius LLP

(57) ABSTRACT

Attempted is to provide a semiconductor light-emitting device capable of inexpensively coping with an encoder requiring high resolving power. Provided are a semiconductor light-emitting element, a light-transmissive resin mold part encapsulating the semiconductor light-emitting element, and converting means for converting the output light from the semiconductor light-emitting element and emitting it.

Also, a lens (5a) outwardly projecting in a dome form is formed in a mold part (5) of a light-transmissive resin material of an LED (1). The output light emitted at different angles toward the front from a light-emitting layer (1d) formed on a side surface of a LED element (1x) travels by being converted into a collimate light through a lens (5a) formed in the mold part (5). The collimate luminous flux (La) is outputted from spot light sources at points on the lens (5a), as viewed from a moving direction of a measuring plate (11x). By using an output light emitted parallel from the spot light sources in multiplicity formed on the lens (5a), measured is a moving velocity of a measuring plate (11x) forming fine slits (a–N).

8 Claims, 6 Drawing Sheets

SEMICONDUCTOR LIGHT-EMITTING DEVICE

TECHNICAL FIELD

The present invention relates to a semiconductor light-emitting device of which structure is inexpensively cope with a light-emitting part of an encoder that is requiring high resolving power.

BACKGROUND OF THE INVENTION

There are known, as a photo-encoder using an optical device, a linear encoder for detecting a moving velocity of an object and a rotary encoder for detecting a rotating angle. The optical devices for such photo-encoders includes an example using a semiconductor light-emitting device such as a light-emitting diode (LED) in the light-emitting part and a semiconductor light-receiving device such as a photodiode in the light-receiving part.

FIG. 10 is a front view of a scheme showing one example of the LED. In FIG. 10, 1 is an LED element, 2, 3 are a pair of lead terminals and 4 is a metal wire. One electrode 1a of the LED element 1 is connected with the metal wire 4. The metal wire 4 is electrically connected to a lead terminal 3 by wire bonding.

Meanwhile, although not shown, an electrode is formed on the LED element 1 at a side opposite to the electrode 1a. This electrode is electrically connected onto the lead terminal 2 by die bonding. Numerical reference 5 shows a mold part formed of a light-transmissive resin to encapsulate the LED element 1 and metal wire 4. In this manner, an LED 20 for an encoder is formed. This LED 20 is structured to emit an infrared ray, for example.

FIG. 11 is an explanatory view showing an example using an LED 20 structured in FIG. 10 as a linear encoder. In FIG. 11, 10 shows an optical system using a lens, in which the numerical reference 11 is a rectangular measuring plate forming a multiplicity of slits a–n, the numerical reference 12 is a light-receiving part using a light-receiving element such as a photodiode, the numerical reference 13 is a signal line, and the numerical reference 14 is a signal processing section.

The LED 20 operable as a surface light source. The LED 20, at a mold part 5 close to a light-emitting surface, emits an output light having a width Lx. The optical system 10 focuses the output light having a width Lx emitted from the LED 20 and converts it into spot light sources to travel as a luminous flux toward the light-receiving part 12.

When the measuring plate 11 is moved in the arrow direction A, the light-receiving part 12 receives and blocks light depending upon a presence or absence of a slit a–N formed in the measuring plate 11. The signal received or blocked by the light-receiving part 2 is properly processed in the signal processing section 4 to form a pulse waveform. By counting pulses in one period, it is possible to detect a moving velocity of the measuring plate 11.

In place of the rectangular measuring plate 11 moving linearly, a rotary encoder can be structured to detect a rotating angle of a rotary plate by arranging a rotary plate, for rotation, circumferentially forming a multiplicity of slits between the optical system 10 and the light-receiving part 12 and properly processing, in the signal processing section 14, the signal received or blocked by the light-receiving part 12.

In this manner, in the conventional encoder, the output light emitted from a semiconductor light-emitting device having a surface light source, such as an LED, is focused by the optical system and converted into spot light sources. However, in order for conversion into precise spot light sources, the optical system must use a multiplicity of lenses. There has been a problem with increased cost.

The luminous flux in a state not converted into spot light sources, if made to travel toward the measuring plate, results in worsened resolution. In particular, there has been a problem of the impossibility to cope with an encoder having a fine slit formed in the measuring plate to form a signal by receiving and blocking a luminous flux thereby performing signal processing with resolution. Meanwhile, spot light sources for an encoder can be obtained by laser light. In this case, there has been a problem of cost increase.

The present invention has been made in view of such problems, and it is an object to provide a semiconductor light-emitting device applicable as an encoder linear light source by a simple structure.

Also, it is an object to provide a semiconductor light-emitting device structured, to inexpensively cope with, as an encoder light-emitting part requiring high resolving power.

DISCLOSURE OF THE INVENTION

The foregoing object of the present invention is achieved by a semiconductor light-emitting device comprising: a semiconductor light-emitting element, a light-transmissive resin mold part encapsulating the semiconductor light-emitting element, and converting means for converting an output light from the semiconductor light-emitting element into a linear light source to be emitted.

Also, desirably, the converting means is a light blocking member having a slit and structured to emit an output light passed through the slit.

Also, desirably, the converting means is arranged on a light-emitting surface of the semiconductor light-emitting element and a light blocking member having a slit, the resin mold part encapsulating the light blocking member together with the semiconductor light-emitting element.

Also, desirably, the light blocking member is a metal plate having a slit.

Also, desirably, the metal plate is extended from the resin mold part and bent to along an outer surface of the resin mold part.

Also, desirably, the converting means is structured by a resin mold part of a light-transmissive resin, the resin mold part has a slit in a region corresponding to a light-emitting surface of the semiconductor light-emitting element and structured to derive light of the semiconductor light-emitting element through the slit. Also, desirably, the semiconductor light-emitting element at a surface is covered with the light-transmissive resin.

Also, desirably, the converting means is a die pad having a slit, the semiconductor light-emitting element being firmly fixed, face down, on the die pad by using a light-transmissive insulation resin.

Also, desirably, the semiconductor light-emitting device is structured to emit light at a side surface.

Also, desirably, the converting means is a light blocking member having a slit attached on an outside of the resin mold part.

Also, the converting means is a cover forming a slit, the cover being fitted on a light-emitting surface of the semiconductor light-emitting element and encapsulated by the mold part of a light-transmissive resin to emit the output light passed the slit.

According to the above feature, there is provided the converting means for emitting the output light of the surface light source by converting it into a linear output light. Consequently, because the structure is simple and moreover a fine, linear light source is obtained, the semiconductor light-emitting device can be applied as a light source of an encoder.

Meanwhile, in the invention, the semiconductor light-emitting device after fitted with a cover forming a slit in a light-emitting surface is encapsulated by a mold part of a light-transmissive resin material. Consequently, the cover is firmly fixed by the mold part without causing positional deviation. Also, there undergoes no affection due to positional deviation in the LED element during die bonding. Accordingly, linear output light can be emitted with accuracy.

Furthermore, the foregoing object of the invention is achieved by a structure of a semiconductor light-emitting device comprising: a semiconductor light-emitting element forming, on a side surface, a light-emitting layer to be used as a light source of a linear light source and a mold part formed of a light-transmissive resin encapsulating the semiconductor light-emitting element, wherein a lens is formed outwardly projecting in a dome form in a surface of the mold part where an output light is to be emitted from the light source of the linear light source toward a light receiving part, the light source of the linear light source being converted by the lens into a multiplicity of light sources of spot light sources to emit a collimate output light at the spot light sources in multiplicity formed on the lens.

Meanwhile, preferably, the linear light source is a linear member arranged to pass a focal point of the lens.

According to the above feature of the invention, a lens is formed by a mold part of a light-transmissive resin material. This lens converts the light source of a linear light source into a multiplicity of light sources of spot light sources. Because a collimate output light is emitted from the spot light sources in multiplicity formed on the lens, when a measuring plate forming fine slits is moved, the light-receiving part can receive or block light with accuracy. Accordingly, the semiconductor light-emitting device can be coped with as a light-emitting part of an encoder requiring signal processing with resolution.

By arranging the linear light source to pass a focal point of the lens, it is possible to obtain a further preferred collimate light source.

Figure 1:
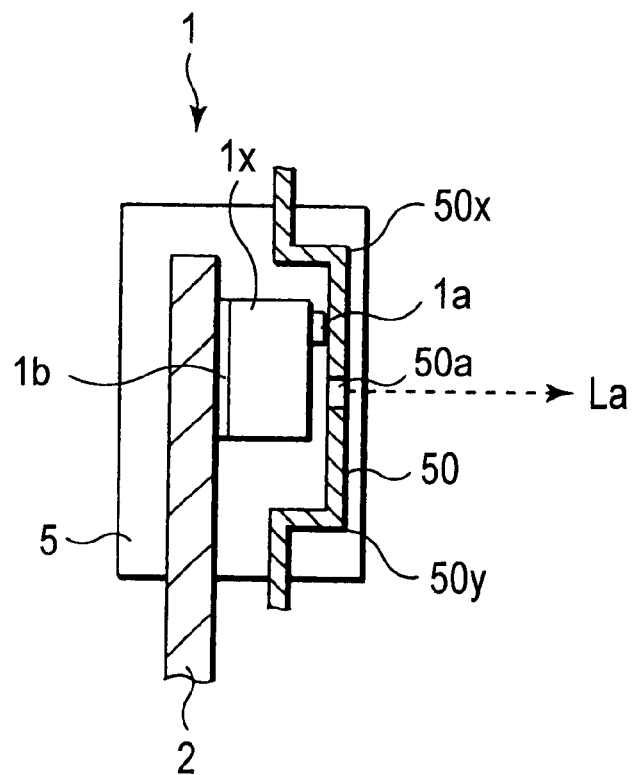
FIG. 1 is a side view showing a semiconductor light-emitting device according to an embodiment of the invention.

Note that the reference numeral 1 in the figures is a semiconductor light-emitting device (LED), 1x an LED element, 1c an n-type semiconductor, 1d a light-emitting layer, 1e a p-type semiconductor, 2, 3 lead terminals, 4 a metal wire, 5 a mold part of a light-transmissive resin material, 5a a lens, 10 an optical system, 11x a measuring plate, 12 a light-receiving part, 13 a signal line, 14 a signal processing section, a–N slits, a–n slits of the conventional example, and La, Lx, Ly luminous flux.

BEST MODE FOR CARRYING OUT THE INVENTION

Hereunder, the embodiments of the present invention will be explained with reference to the drawings.

Embodiment 1

Figure 2:
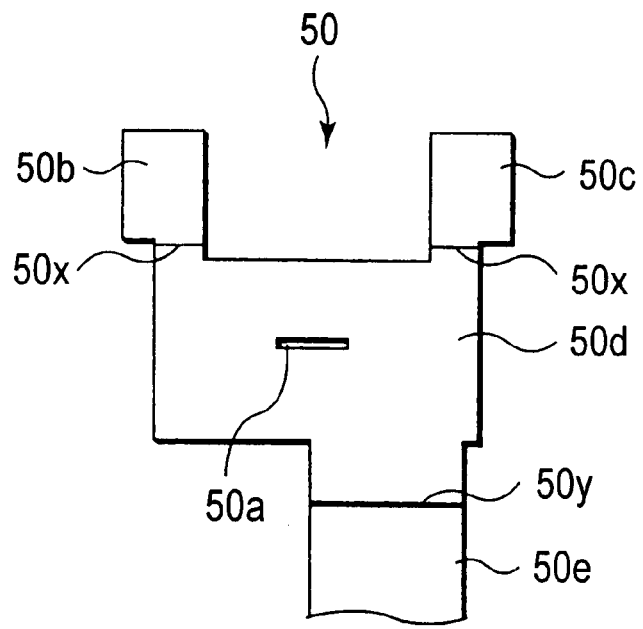
FIG. 2 is a front view showing a cover of FIG. 1.

FIG. 1 is a side view of a semiconductor light-emitting device according to Embodiment 1 of the invention, while FIG. 2 is a development front view of a cover to be used in the semiconductor light-emitting device. In FIG. 2, a cover 50 is formed by blanking a thin metal sheet, such as a stainless metal sheet, for instance the standard number SUS #304.

The numerical reference 50a is a slit formed horizontally long with a narrow width, 50b and 50c the ear pieces formed at an upper both sides, 50d a cover body, and 50e a leg portion. Bending lines 50x are formed between the cover body 50d and the both-sided ear pieces 50b, 50c. Meanwhile, a bending line 50y is formed between the cover body 50d and the leg 50e.

The cover 50 shown in FIG. 2 is bent along the bending lines 50x, 50y and fitted onto a light-emitting surface of an LED device. FIG. 1 is a side view of a scheme showing a state the cover 50 is fitted on a light-emitting surface of an LED.

As shown in FIG. 1, in a semiconductor light-emitting device used in this semiconductor light-emitting device, an LED element 1x is provided with an electrode 1a and an electrode 1b. The electrode 1b is electrically connected on a lead terminal by die bonding. Meanwhile, although not shown, a bonding wire made by a metal thin wire is connected to the electrode 1a. This bonding wire is electrically connected to the other lead terminal by wire bonding.

The cover 50 is aligned such that the light-emitting surface of the LED element 1x at a center position comes to a position of the slit 50a, and then bent at the bending lines 50x, 50y to the horizontal. Furthermore, the ear pieces 50b, 50a and the leg 50e are bent at proper positions to the vertical. The cover 50 is arranged at the front of the light-emitting surface of the LED element 1x and temporarily fixed as required.

In this manner, the cover SO after being arranged at the front of the light-emitting surface of the LED element 1x is resin-encapsulated by a transparent resin material. The LED element 1x and the bonding wire are encapsulated by a resin mold part 5 to form an LED 1. Consequently, the cover 50 is firmly fixed by the resin mold part 5 and prevented against the occurrence of positional deviation. Meanwhile, there is no affection by the positional deviation in the LED element of upon die bonding.

Figure 10:
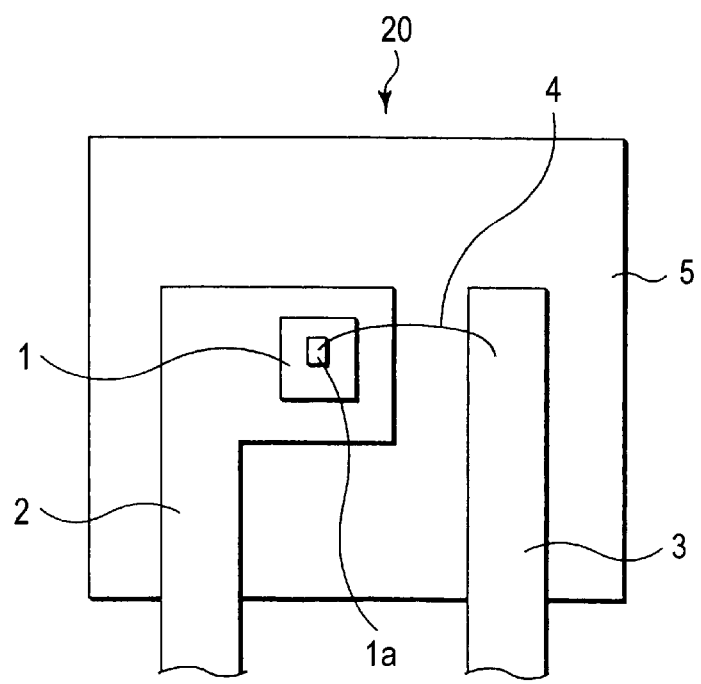
FIG. 10 is a front view showing a conventional semiconductor light-emitting device.
Figure 11:
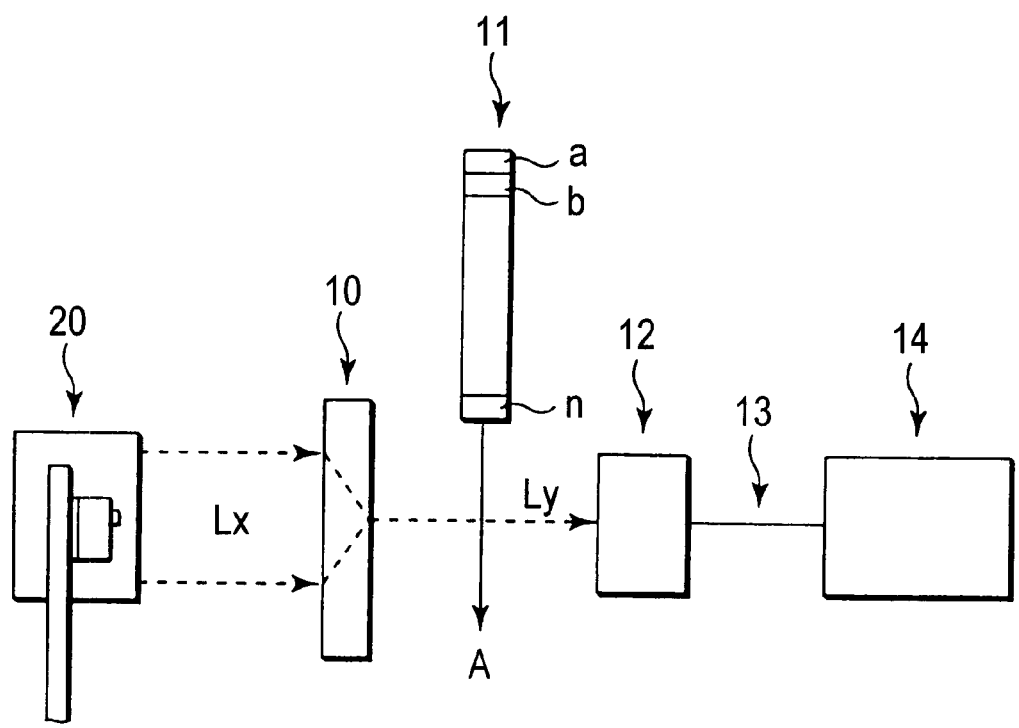
FIG. 11 is an explanatory view of an example using the semiconductor light-emitting device as a linear encoder.

Because the LED 1 of FIG. 1 is fitted with the cover aligned in position at the horizontally-long, width-narrowed slit on a center position of the light-emitting surface of the LED element 1x, the output light emitted from the LED element 1x passes at only the slit 50a whereby a luminous flux La travels toward a light-receiving part. The luminous flux La is formed parallel with the slits formed in a measuring plate 11 shown in FIG. 10.

The widthwise size of the slit 50a can be made to a fine size down to a limit that the required amount of light is to be obtained. Accordingly, when the measuring plate having the slits is moved toward the luminous flux La, the light-receiving part can obtain accurate signals correspondingly to the reception and blocking of light.

Meanwhile, the cover 50 having the slit 50a can be easily formed by blanking.

Figure 3:
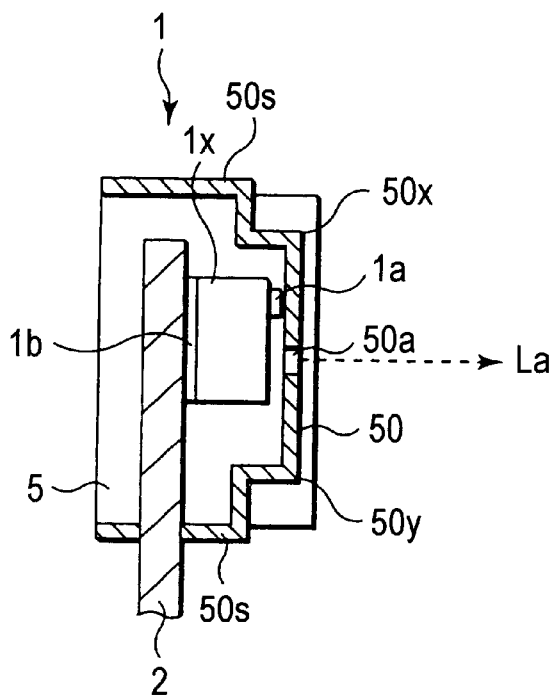
FIG. 3 is a side view showing a semiconductor light-emitting device according to another embodiment of the invention.

Incidentally, the cover 50 may form light-blocking side pieces 50s by being bent to cover the outer side surfaces of the resin mold 5 after resin encapsulation, as shown in FIG. 3. According to this structure, light is favorably confined to making it possible to enhance the intensity of light through the slit 50a.

Figure 4:
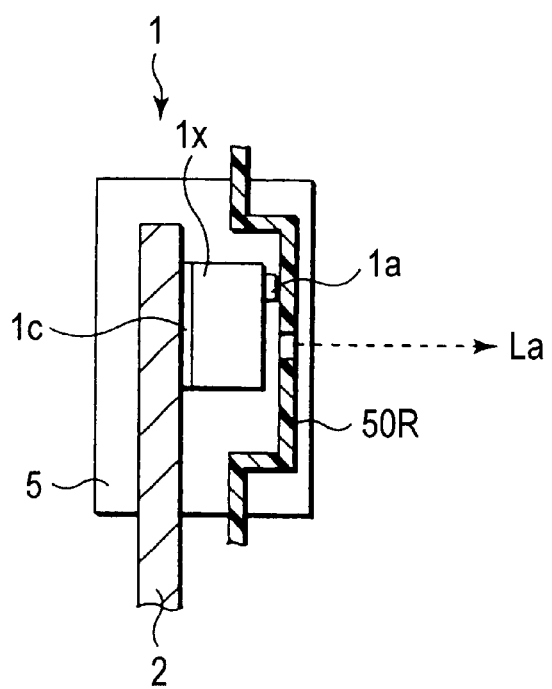
FIG. 4 is a side view showing a semiconductor lights-emitting device according to another embodiment of the invention.

Meanwhile, in place that a cover 50 is formed by blanking and bent and fitted onto the light-emitting surface of the LED element 1x, it may be formed by molding into a shape having a side surface as shown in FIG. 1. Namely, as shown in FIG. 4, a cover 50R having a slit 50a can be molded by using a light-blocking synthetic resin material, which is again molded together with the synthetic-resin-make cover 50R by using a transparent resin.

Figure 5:
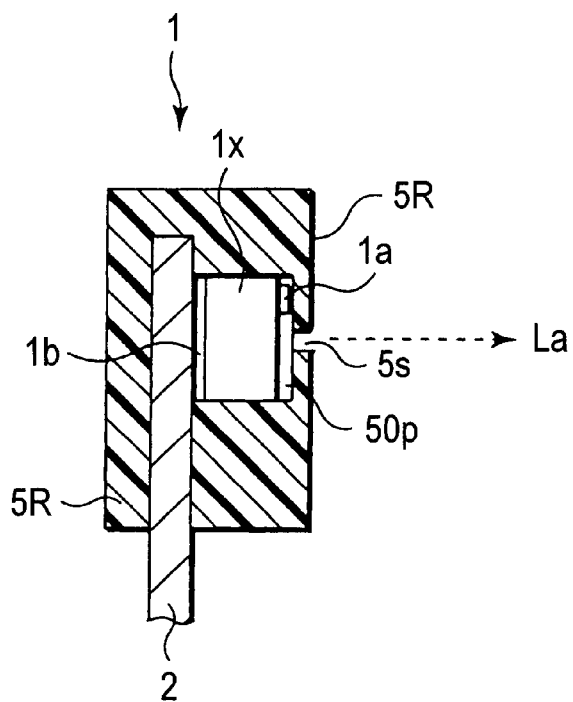
FIG. 5 is a side view showing a semiconductor light-emitting device according to another embodiment of the invention.

Furthermore, as shown in FIG. 5, the LED element 1x at least at and around its light-emitting surface may be covered with a transparent resin 50P by potting, which at an exterior is molded by using a light-blocking resin thereby forming a semiconductor light-emitting device having a slit. At this time, for a slit 5s, a projection is previously formed in a region of a metal mold corresponding to a slit so that the projection abuts against an outer surface of the transparent resin 50P.

Also, the mold resin may be previously formed of a light-blocking photosensitive resin so that the light-blocking photosensitive resin is selectively removed by photolithography to form a slit.

Figure 6:
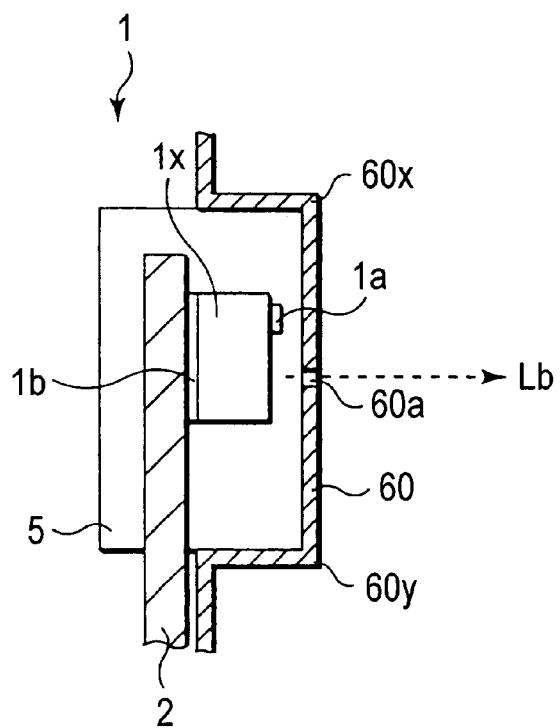
FIG. 6 is a side view showing a semiconductor light-emitting device according to another embodiment of the invention.

Meanwhile, besides the structure by simultaneous molding, an external cover may be provided. FIG. 6 is a side view of a scheme of a semiconductor light-emitting device according to another embodiment of the invention. In an example of FIG. 6, a cover 60 forming a slit 60a is fitted on an output-light emitting surface of a mold part 5 formed of a transparent resin material. 60x and 60y are bent points of the cover 60. The output light emitted from the LED element 1x passes only at the slit 60a, so that a luminous flux Lb travels toward the light-receiving part.

In this manner, because the cover is fitted on the output-light emitting surface of the mold part 5 by using the structure of FIG. 5, it can be directly attached to an existing semiconductor light-emitting device. Also, in the structure of FIG. 1, because molding is done of a light-blocking resin material after fitting the cover 50 on the light-emitting surface of the semiconductor light-emitting element 1x, there is a need to align the cover 50 during molding. Contrary to this, the structure of FIG. 3 allows the cover to be easily fitted on the output-light emitting surface of the mold part 5 by previously forming a slit 60a and bending points 60x, 60y matching to the size of the output-light emitting surface of the mold part 5.

Figure 7:
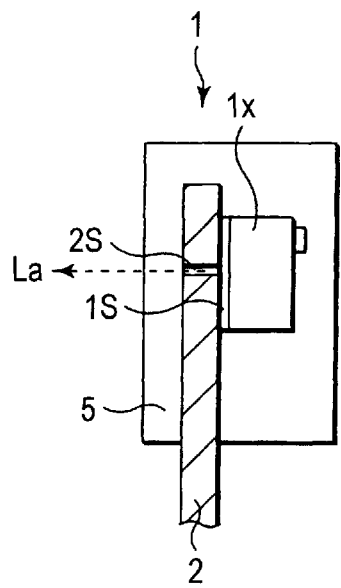
FIG. 7 is a side view showing a semiconductor light-emitting device according to another embodiment of the invention.

Meanwhile, in place of blocking an output light of the surface light source by a cover forming a slit and converting it into a linear light source as in the example shown in FIGS. 1 and 3 to 6, a linear light source can be formed by leaving a proper position of an output-light emitting surface of the LED element of after die bonding in a slit form and covering the other region by a process of ink jet spray. Incidentally, as showing an example in FIG. 7, a linear light source can also be formed by forming a slit 2s in a die pad of the lead terminal 2 for mounting a semiconductor light-emitting element 1x and firmly fixing the semiconductor light-emitting element, face down, on the die pad 2D formed at the tip of the lead terminal 2 by using a light-transmissive insulation resin 1s to use the slit-formed surface as a light-emitting plane.

By using a rotary plate circumferentially forming a multiplicity of slits in place of a linear encoder using a measuring plate having slits parallel with a traveling direction of luminous flux, the LED 1 structured shown in FIG. 1 or the like can be used as a light source of a rotary encoder.

Embodiment 2

Figure 8:
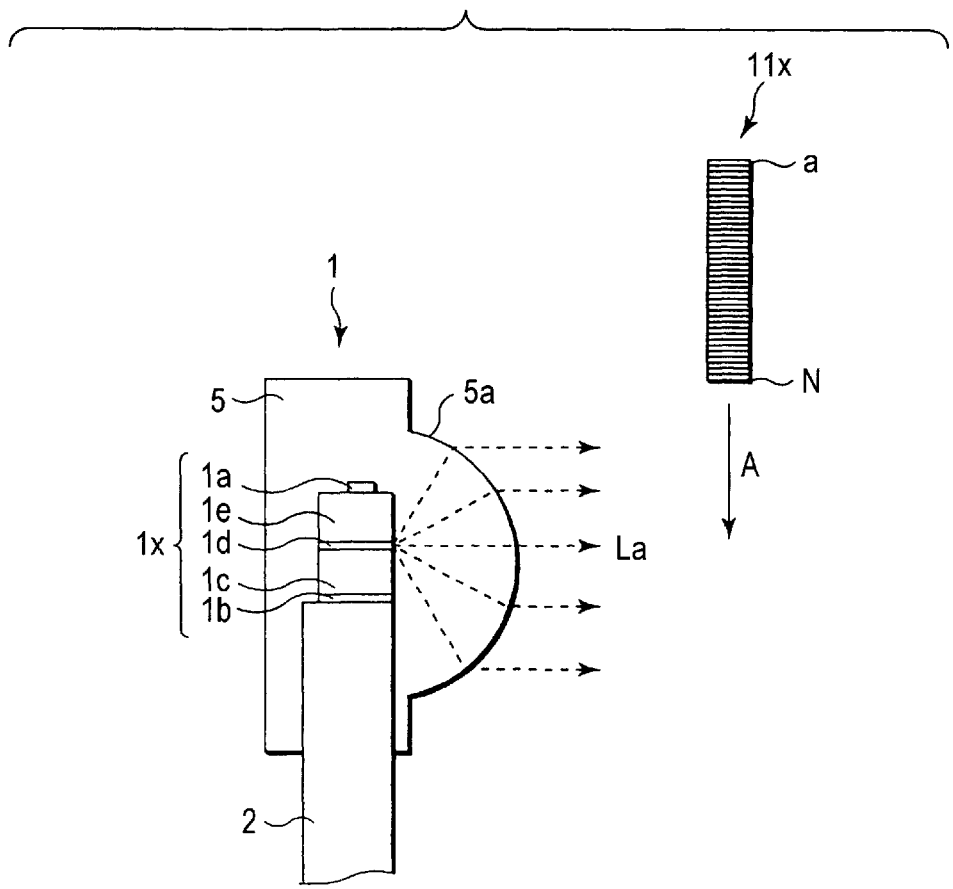
FIG. 8 is a side view showing a semiconductor light-emitting device according to a second embodiment of the invention.
Figure 9:
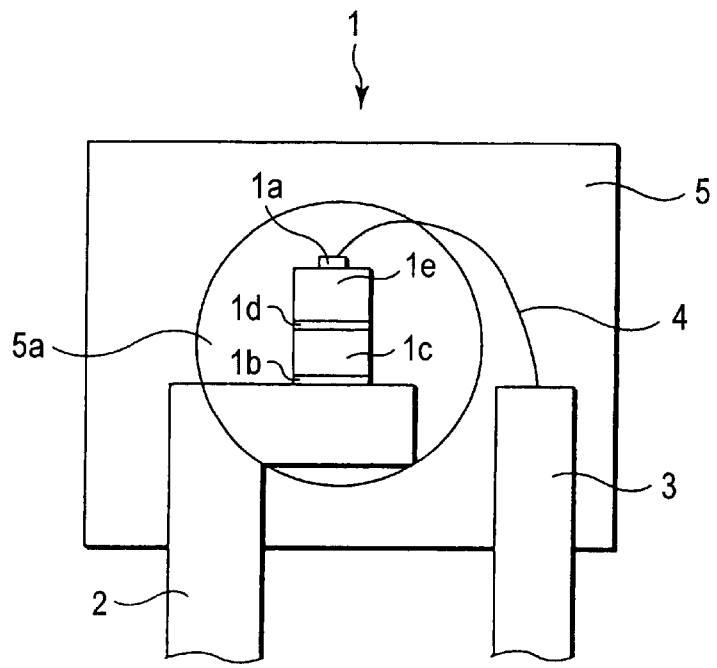
FIG. 9 is a front view of FIG. 4.

FIG. 8 is a side view showing an example of a semiconductor light-emitting device according to a second embodiment of the invention. FIG. 9 is a front view. In FIG. 8, a semiconductor light-emitting element (LED element) 1x has an anode electrode 1a, a cathode electrode 1b, an n-type semiconductor 1c and a p-type semiconductor 1e. A light-emitting layer 1d is formed in a junction between the n-type semiconductor 1c and the p-type semiconductor 1e.

In a mold part 5 of a light-transmissive resin of the LED 1, a lens 5a is formed outwardly projecting in a dome form having a surface opposed to a light-emitting layer of the LED element 1x to emit output light to a light-receiving element. The output light, emitted toward the front at different angles from the light-emitting layer 1d formed on a side surface of the LED element 1x, is converted into a multiplicity of spot light sources through the lens 5a formed in the mold part 5. A collimate luminous flux La is formed at the spot light sources in multiplicity to travel toward the light-receiving part.

The collimate luminous flux La is outputted at the spot light sources on various points of the lens 5a, as viewed from a moving direction A of the measuring plate 11x as mentioned before. Namely, in the invention, a multiplicity of spot light sources are formed on the lens 5a formed in the mold part 5. By moving the measuring plate 11x forming a multiplicity of slits relatively to the output light emitted parallel from the spot light sources, the light-receiving part forms signals of light blocking and reception to measure a moving velocity of the measuring plate 11x.

In this manner, because the light-emitting part is formed with the spot light sources in multiplicity, even where fine slits a–N are formed in the measuring plate 11x, when the measuring plate 11x is moved in the arrow direction A, the light-receiving part can accurately receive and block light to process signals with resolution.

Accordingly, the LED 1 structured in FIG. 8 can cope, as a light-emitting part, with an encoder requiring high-resolution signal processing. As an example, a multiplicity of outputs in the number of 150 per inch of collimate light can be formed from the spot light sources of the lens 5a.

INDUSTRIAL APPLICABILITY

As explained in the above, according to the above feature, there is provided converting means for emitting the output light of the surface light source by converting it into a linear light source. Consequently, because the structure is simple and moreover a fine, linear light source can be obtained, the semiconductor light-emitting device can be applied as a light source of an encoder.

Meanwhile, the semiconductor light-emitting device is fitted with a cover forming a slit at a light-emitting surface and encapsulated by a mold part of a light-transmissive resin material. Consequently, the cover is firmly fixed by the mold part without causing positional deviation. Also, there undergoes no affection due to positional deviation in the LED element during die bonding. Accordingly, a linear output light can be emitted with accuracy.

Furthermore, a lens is formed by a mold part of a light-transmissive resin material. This lens converts the light source of a linear light source into a multiplicity of light sources of spot light sources. Because a collimate output light is emitted from the spot light sources in multiplicity formed on the lens, when a measuring plate forming fine slits is moved, the light-receiving part can receive or block light with accuracy. Accordingly, the semiconductor light-emitting device can be coped with a light-emitting part of an encoder requiring signal processing with resolution.

What is claimed is:

1. A semiconductor light-emitting device comprising:
   a semiconductor light-emitting element;
   a light-transmissive resin mold part encapsulating said semiconductor light-emitting element; and
   converting means integrally formed with said resin mold part to convert an output light from said semiconductor light-emitting element into a linear light source to be emitted,
   wherein said converting means is a light blocking member arranged on a light-emitting surface of said semiconductor light-emitting element having a slit and a part extending from said resin mold part, said resin mold part encapsulating said light blocking member together with said semiconductor light-emitting element.

2. A semiconductor light-emitting device according to claim 1, wherein said light blocking member is a metal plate having a slit and extended to a side portion of said resin mold part.

3. A semiconductor light-emitting device according to claim 2, wherein said metal plate is extended from said resin mold part and bent along an outer surface of said resin mold part.

4. A semiconductor light-emitting device comprising:
   a semiconductor light-emitting element;
   a light-transmissive resin mold part encapsulating said semiconductor light-emitting element; and
   converting means integrally formed with said resin mold part to convert an output light from said semiconductor light-emitting element into a linear light source to be emitted,
   wherein said resin mold part is formed of a light blocking resin having a slit in a region corresponding to a light-emitting surface of said semiconductor light-emitting element and structured to derive light of said semiconductor light-emitting element through said slit.

5. A semiconductor light-emitting device according to claim 4, wherein said semiconductor light-emitting element at a surface is covered with the light-transmissive resin applied by potting.

6. A semiconductor light-emitting device according to claim 5, wherein said converting means is a die pad having a slit, said semiconductor light-emitting element being firmly fixed, face down, on the die pad by using a light-transmissive insulation resin.

7. A semiconductor light-emitting device comprising:
   a semiconductor light-emitting element;
   a light-transmissive resin mold part encapsulating said semiconductor light-emitting element; and
   converting means integrally formed with said resin mold part to convert an output light from said semiconductor light-emitting element into a linear light source to be emitted,
   wherein said semiconductor light-emitting element is structured to emit light at a side surface and used as a light source of a linear light source,
   said resin mold part forming a lens by being outwardly projected in a surface where an output light from the light source of the linear light source is to be emitted toward a light-receiving part,
   said lens converting the light source of the linear light source into light sources of a multiplicity of spot light sources to emit a collimated output light from the spot light sources in multiplicity formed on said lens, and
   a measuring plate including a plurality of slits is located in the path of said collimated output light.

8. A semiconductor light-emitting device according to claim 7, wherein the semiconductor light emitting element is a linear member arranged in a position passing a focal point of said lens.

* * * * *